United States Patent [19]

Flora et al.

[11] Patent Number: 5,426,388

[45] Date of Patent: Jun. 20, 1995

[54] REMOTE TONE BURST ELECTROMAGNETIC ACOUSTIC TRANSDUCER PULSER

[75] Inventors: John H. Flora; Daniel T. MacLaughlan, both of Lynchburg, Va.

[73] Assignee: The Babcock & Wilcox Company, New Orleans, La.

[21] Appl. No.: 196,662

[22] Filed: Feb. 15, 1994

[51] Int. Cl.[6] .......................... H03K 1/00; H03K 3/57
[52] U.S. Cl. .................................... 327/110; 327/108; 327/181
[58] Field of Search ................ 327/108, 110, 181, 190, 327/300, 304, 336, 182, 183, 365; 331/74

[56] References Cited

U.S. PATENT DOCUMENTS 3,916,373  10/1975  Schroder .............................. 327/110
5,095,224   3/1992  Renger ................................ 327/110

*Primary Examiner*—Timothy P. Callahan
*Assistant Examiner*—Toan Tran
*Attorney, Agent, or Firm*—Daniel S. Kalka; Robert J. Edwards

[57] ABSTRACT

A remote tone burst pulser for an electromagnetic acoustic transducer utilizes a circuit having a direct current power source which is provided to a main capacitor. A high power, high speed insulated gate bipolar transistor or metal oxide-semiconductor controlled thyristor is operatively connected to the main capacitor and the coil of the transducer. A drive circuit is operatively connected to this device for transmitting a train of switch pulses which causes radio frequency alternating current to be provided to the transducer coil. A power transistor is operatively connected to the first transistor and is activated by a second drive circuit for causing a conducting state which allows for the power being applied to the transducer coil to be rapidly dissipated by a resistor and the internal resistance of the power transistor.

5 Claims, 1 Drawing Sheet

REMOTE TONE BURST ELECTROMAGNETIC ACOUSTIC TRANSDUCER PULSER

BACKGROUND OF THE INVENTION

1. Field of the Invention

The present invention relates, in general, to electromagnetic acoustic transducers, and in particular, to a new and useful circuit for providing remote tone bursts to an electro-magnetic acoustic transducer.

2. Description of the Related Art

Electromagnetic acoustic transducers (EMATs) are relatively new devices which are used to nondestructively test metal components and structures. EMAT systems have been developed and have been used in an increasing number of applications throughout many types of industry. EMATs can perform ultrasonic inspections without the use of a fluid couplant which is required with conventional piezoelectric ultrasonic transducers. Inspection with EMATs is fast, easy to automate and does not contaminate the component being inspected.

A majority of EMAT applications use meanderline coils to generate acoustic waves directly in the metal components being inspected. This requires the transmission of a few cycles (typically 1 to 16) of radio frequency (RF) alternating current to excite the coil and induce the ultrasonic wave. This high-frequency tone burst is presently provided by a commercially available RF amplifier. Peak tone burst currents required for good EMAT performance are on the order of 100 to 200 amperes. Remote operation of EMATs with currently available electronic instrumentation requires the transmission of these RF currents through cables as long as 200 feet. This results in loss of power, decreased sensitivity and radiation of RF electromagnetic interference signals which can affect instruments and controls in nearby systems.

SUMMARY OF THE INVENTION

The present invention pertains to electromagnetic acoustic transducers (EMATs). The present invention is a circuit which allows for remote tone bursts to be provided to an EMAT in pulses.

The present invention is a circuit which transmits radio frequency current to the coil of an EMAT by utilizing a direct current (DC) power source and a main capacitor operatively connected to the power source for receiving the direct current, and in turn, providing a radio frequency alternating current. A first transistor, which is a high power, high speed semiconductor device, such as an insulated gate bipolar transistor or a metal oxide-semiconductor controlled thyristor, is operatively connected to the main capacitor in order to receive the radio frequency current. A second transistor is operatively connected to the first transistor, and a choke coil is operatively connected to the first transistor and the transducer of the EMAT. A tuning capacitor is operatively connected to the first transistor and the choke coil.

Isolated drive circuitry is connected to the first transistor and the second transistor respectively. The drive circuitry at the first transistor transmits a train of pulses to the first transistor which allows the first transistor to pulsate the radio frequency current to the choke coil and the transducer coil as well as the tuning capacitor. The radio frequency current is used to excite the coil of the EMAT; and the EMAT coil and the choke coil resonate along with the tuning capacitor until the oscillation is stopped when the isolated drive of the second transistor activates the second transistor into a conducting state such that the power being provided to the EMAT coil is rapidly dissipated and the main capacitor can recharge.

The first and second transistors are switching transistors which can be triggered by optical signals through optical coupling devices provided to the drive circuitry of the EMAT coil pulser.

It is an object of the present invention to provide a circuit for an electromagnetic acoustic transducer which alleviates the need for a radio frequency power amplifier.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENTS

Figure 1:
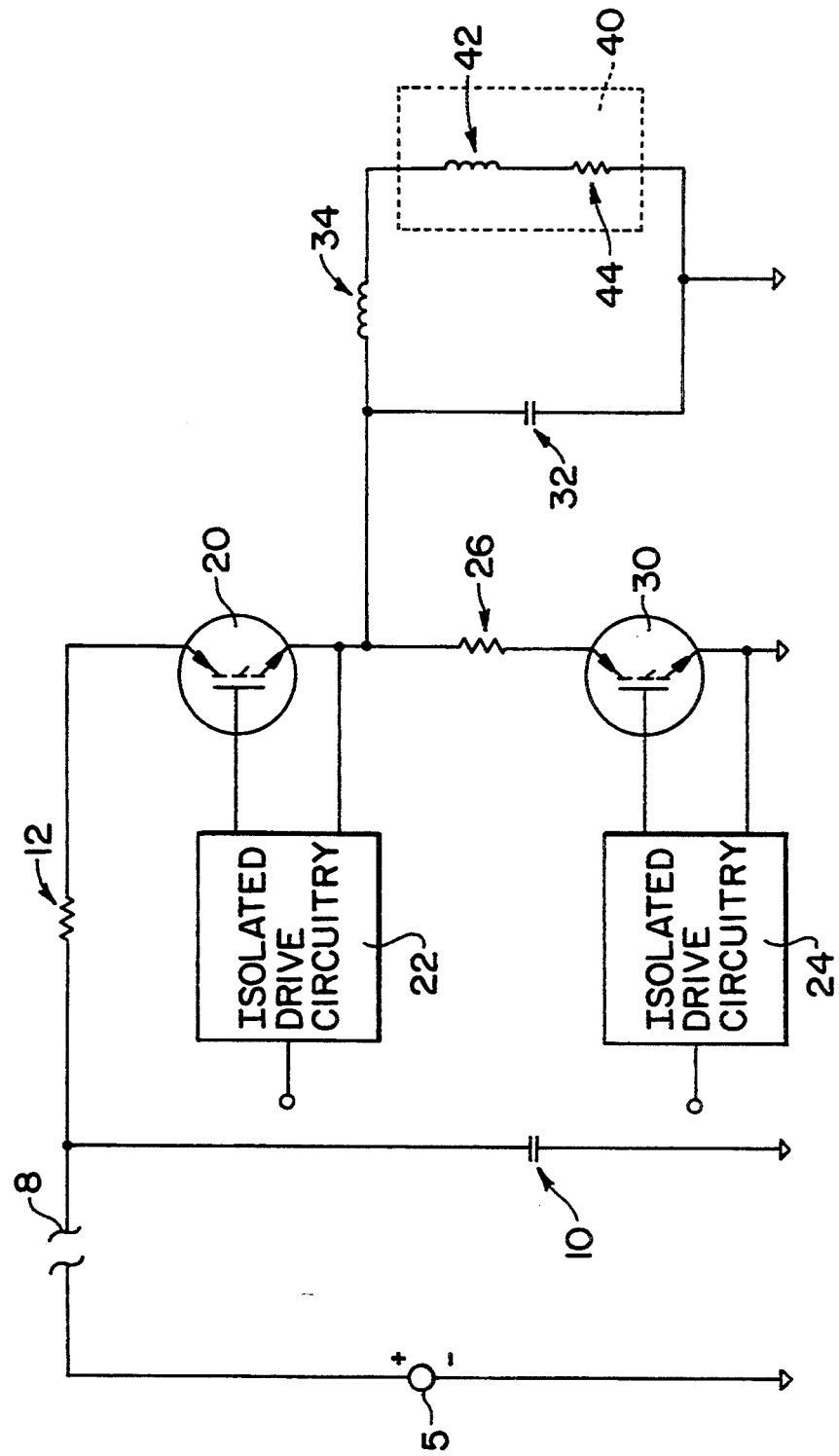
FIG. 1 is a schematic view illustrating a circuit according to the present invention.

The present invention is a small, light-weight circuit, i.e., a remote tone burst pulser, which is used in conjunction with an electromagnetic acoustic transducer (EMAT). The present invention is installed in the EMAT instead of being installed in the instrumentation of the EMAT which eliminates the requirement of having to transmit radio frequency (RF) power, which is normally transmitted along very long cables, which is utilized by the known devices.

As shown in FIG. 1, the present invention utilizes a DC power source 5 and a power cable 8. A main capacitor 10 is operatively connected to the power source 5 through cable 8 and is charged through the relatively small, direct current provided through cable 8. A high-power, high-speed semiconductor device 20, which is a transistor such as a insulated gate bipolar transistor or a metal-oxide-semiconductor controlled thyristor is operatively connected to the main capacitor 10. A resistor 12 is connected between the capacitor 10 and the transistor 20.

Transistor 20 is used to excite an EMAT coil 42 of an EMAT 40 for inducing ultrasonic waves. A choke coil 34 is operatively connected to the transistor 20 between the transistor 20 and EMAT coil 42. A tuning capacitor 32 is also operatively connected to the transistor 20.

Isolated drive circuitry 22 is operatively connected to transistor 20 for activating transistor 20 to transmit the radio frequency current to the choke coil 34, and in turn, the EMAT coil 42, and the tuning capacitor 32. The radio frequency alternating current transmitted by the transistor 20 causes the EMAT coil 42 and the choke 34 to resonate along with the tuning capacitor 32.

A second transistor 30 is also used in conjunction with the first transistor 20. A resistor 26 is operatively connected between the first transistor 20 and the second transistor 30. Isolated drive circuitry 24 is operatively connected to the power transistor 30 for switching the power transistor 30 to a conducting state such that when transistor 30 is conducting, the power being supplied to the EMAT coil 42 from the first transistor 20 is rapidly dissipated in resistor 26 and the internal resistance of transistor 30. During tone bursts, the main capacitor 10 recharges through cable 8 and the power source 5.

A portion of each burst of RF power provided by transistor 20 is dissipated in the EMAT coil 42. Part of the energy dissipated is in the form of ultrasonic energy converted by transducer 40 and part by heat loss, i.e, resistance and any current losses, in the EMAT coil circuit 40 through resistor 44.

If transistor 20 is switched on only once after the start of each tone burst, the RF current will decay exponentially at a rate determined primarily by the loss factors. In some cases, this will lead to a less than maximum amplitude of the ultrasonic wave and less than ideal ultrasonic pulse shape.

The present invention easily corrects these problems by having drive circuit 22 transmit a train of switching pulses, instead of only one pulse, to transistor 20 during the tone burst. The start and duration of each switching pulse controls the peak amplitude of the RF current and the shape of the tone burst. The pulse trains are easily generated by the computer-base circuitry 22 of the EMAT instrumentation.

According to the present invention, the switching transistors 20 and 30 are triggered by optical signals through optical devices used in conjunction with drive circuits 22 and 24. This virtually eliminates the problems and costs for transmitting RF power encountered by the known devices. The present invention allows for the maximum sensitivity of the EMAT to be obtained while at the same time minimizing electromagnetic interference problems.

The present invention provides a remote tone burst pulser circuit that replaces oscillators in RF amplifiers which are currently used in EMAT instrumentation which reduces the cost of EMAT instrumentation by a substantial amount as well as improving the overall performance of EMATs. Since the switching control for transistors 20 and 30 requires only a few microamperes of current, minimal RF power is required to be transmitted over the cables which connect the EMAT to the support instrumentation.

The present invention allows for a substantial reduction or elimination of RF power losses and cables. The present invention also replaces the RF power amplifiers currently used in the EMAT systems. The present invention also eliminates transformers which are normally required for impedance matching between the EMAT coil and the RF cable. Additionally, the present invention substantially reduces electromagnetic radiation interference with electronic circuitry in other nearby systems or in other parts of the EMAT inspection system.

While specific embodiments of the invention have been shown and described in detail to illustrate the application of the principles of the invention, it will be understood that the invention may be embodied otherwise without departing from such principles.

What is claimed is:

1. A circuit for transmitting radio frequency current to an electromagnetic acoustic transducer having a coil, the circuit comprising:
    a power source for providing direct current;
    a main capacitor operatively connected to the power source for receiving direct current and providing a radio frequency current;
    first transistor means operatively connected to the main capacitor for receiving the radio frequency current;
    second transistor means operatively connected to the first transistor means;
    a choke coil operatively connected to the first transistor means and the transducer coil;
    a tuning capacitor operatively connected to the first transistor means and the choke coil; and
    drive means operatively connected to the first transistor means and the second transistor means, the drive means transmitting a train of pulses to the first transistor means, the first transistor means pulsatingly providing the radio frequency current to the choke coil and the transducer coil and the tuning capacitor, the drive means activating the second transistor means for allowing the second transistor means to conductively receive the radio frequency current from the first transistor means, the radio frequency current being transmitted only to the second transistor means upon activation of the second transistor means.

2. The circuit according to claim 1, wherein the first transistor means comprises an insulated gate bipolar transistor.

3. The circuit according to claim 1, wherein the first transistor means comprises a thyristor.

4. The circuit according to claim 3, wherein the thyristor is a metal-oxide-semiconductor controlled thyristor.

5. The circuit according to claim 1, including a resistor operatively connected between the first transistor means and the second transistor means.

* * * * *